(12) United States Patent
Reddy et al.

(10) Patent No.: US 10,559,461 B2
(45) Date of Patent: Feb. 11, 2020

(54) SELECTIVE DEPOSITION WITH ATOMIC LAYER ETCH RESET

(71) Applicant: Lam Research Corporation, Fremont, CA (US)

(72) Inventors: Kapu Sirish Reddy, Portland, OR (US); Meliha Gozde Rainville, Lake Oswego, OR (US); Nagraj Shankar, Tualatin, OR (US); Dennis M. Hausmann, Lake Oswego, OR (US); David Charles Smith, Lake Oswego, OR (US); Karthik Sivaramakrishnan, Tigard, OR (US); David W. Porter, Sherwood, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 7 days.

(21) Appl. No.: 15/581,951

(22) Filed: Apr. 28, 2017

(65) Prior Publication Data

US 2018/0308680 A1    Oct. 25, 2018

Related U.S. Application Data

(60) Provisional application No. 62/487,411, filed on Apr. 19, 2017.

(51) Int. Cl.
  *C23C 16/44*    (2006.01)
  *H01L 21/02*    (2006.01)
  (Continued)

(52) U.S. Cl.
  CPC ........ *H01L 21/0228* (2013.01); *C23C 16/042* (2013.01); *C23C 16/45527* (2013.01);
  (Continued)

(58) Field of Classification Search
  CPC .................................................. H01L 21/0228
  See application file for complete search history.

(56) References Cited

U.S. PATENT DOCUMENTS

| 4,539,061 A | 9/1985 | Sagiv |
| 4,592,801 A | 6/1986 | Hara et al. |

(Continued)

FOREIGN PATENT DOCUMENTS

| CN | 1550575 A | 12/2004 |
| CN | 1552097 A | 12/2004 |

(Continued)

OTHER PUBLICATIONS

U.S. Notice of Allowance dated Jun. 29, 2017 issued in U.S. Appl. No. 15/400,368.

(Continued)

*Primary Examiner* — Mohammad M Choudhry
(74) *Attorney, Agent, or Firm* — Weaver Austin Villeneuve & Sampson

(57) ABSTRACT

Methods are provided for conducting a deposition on a semiconductor substrate by selectively depositing a material on the substrate. The substrate has a plurality of substrate materials, each with a different nucleation delay corresponding to the material deposited thereon. Specifically, the nucleation delay associated with a first substrate material on which deposition is intended is less than the nucleation delay associated with a second substrate material on which deposition is not intended according to a nucleation delay differential, which degrades as deposition proceeds. A portion of the deposited material is etched to reestablish the nucleation delay differential between the first and the second substrate materials. The material is further selectively deposited on the substrate.

7 Claims, 9 Drawing Sheets

(51) Int. Cl.
*H01L 21/67* (2006.01)
*C23C 16/455* (2006.01)
*C23C 16/52* (2006.01)
*C23C 16/04* (2006.01)
*C23F 1/02* (2006.01)
*C23F 1/08* (2006.01)

(52) U.S. Cl.
CPC ........ *C23C 16/52* (2013.01); *H01L 21/02178* (2013.01); *H01L 21/67167* (2013.01); *C23F 1/02* (2013.01); *C23F 1/08* (2013.01)

(56) References Cited

U.S. PATENT DOCUMENTS

| | | |
|---|---|---|
| 5,282,925 A | 2/1994 | Jeng et al. |
| 5,411,631 A | 5/1995 | Hori et al. |
| 5,501,893 A | 3/1996 | Laermer et al. |
| 5,766,971 A | 6/1998 | Ahlgren et al. |
| 6,083,413 A | 7/2000 | Sawub et al. |
| 6,177,353 B1 | 1/2001 | Gutsche et al. |
| 6,448,192 B1 | 9/2002 | Kaushik |
| 6,482,745 B1 | 11/2002 | Hwang |
| 6,593,000 B2 | 7/2003 | Ohtake et al. |
| 7,196,955 B2 | 3/2007 | Nickel |
| 7,795,148 B2 | 9/2010 | Brown |
| 7,875,312 B2 | 1/2011 | Thridandam et al. |
| 8,043,907 B2 | 10/2011 | Ma et al. |
| 8,252,194 B2 | 8/2012 | Kiehlbauch et al. |
| 8,530,361 B2 | 9/2013 | Xiao et al. |
| 8,592,005 B2 | 11/2013 | Ueda |
| 8,668,957 B2 | 3/2014 | Dussarrat et al. |
| 8,808,561 B2 | 8/2014 | Kanarik |
| 8,821,986 B2 | 9/2014 | Weidman et al. |
| 8,853,075 B2 | 10/2014 | Gatineau et al. |
| 8,883,028 B2 | 11/2014 | Kanarik |
| 8,940,648 B2 | 1/2015 | Xiao et al. |
| 8,945,305 B2 | 2/2015 | Marsh |
| 8,993,352 B2 | 3/2015 | Nishimura et al. |
| 9,130,158 B1 | 9/2015 | Shen et al. |
| 9,219,007 B2 | 12/2015 | Chen et al. |
| 9,257,334 B2 | 2/2016 | Chen et al. |
| 9,257,638 B2 | 2/2016 | Tan et al. |
| 9,331,094 B2 | 5/2016 | Hada |
| 9,371,338 B2 | 6/2016 | Dussarrat et al. |
| 9,449,843 B1 | 9/2016 | Korolik et al. |
| 9,576,811 B2 | 2/2017 | Kanarik et al. |
| 9,805,941 B2 | 10/2017 | Kanarik et al. |
| 9,806,252 B2 | 10/2017 | Tan et al. |
| 9,870,899 B2 | 1/2018 | Yang et al. |
| 9,911,595 B1 | 3/2018 | Smith et al. |
| 9,997,371 B1 | 6/2018 | Agarwal et al. |
| 10,043,656 B1 | 8/2018 | Smith et al. |
| 10,176,984 B2 | 1/2019 | Smith et al. |
| 10,186,426 B2 | 1/2019 | Tan et al. |
| 10,199,212 B2 | 2/2019 | Smith et al. |
| 2001/0053585 A1 | 12/2001 | Kikuchi et al. |
| 2002/0081381 A1 | 6/2002 | DelaRosa et al. |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0017319 A1 | 1/2005 | Manabe et al. |
| 2005/0167399 A1 | 8/2005 | Ludviksson et al. |
| 2005/0208778 A1 | 9/2005 | Li et al. |
| 2006/0009040 A1 | 1/2006 | Tomioka et al. |
| 2006/0128142 A1 | 6/2006 | Whelan et al. |
| 2006/0169669 A1 | 8/2006 | Zojaji et al. |
| 2006/0194435 A1 | 8/2006 | Nishimura et al. |
| 2007/0049036 A1 | 3/2007 | Huang |
| 2007/0238301 A1 | 10/2007 | Cabral et al. |
| 2007/0246442 A1 | 10/2007 | America et al. |
| 2008/0032064 A1 | 2/2008 | Gordon et al. |
| 2008/0242097 A1 | 10/2008 | Boescke et al. |
| 2009/0020884 A1 | 1/2009 | Lee et al. |
| 2009/0256220 A1 | 10/2009 | Horng et al. |
| 2011/0139748 A1 | 6/2011 | Donnelly et al. |
| 2011/0178092 A1 | 7/2011 | Ali et al. |
| 2011/0256721 A1 | 10/2011 | Gatineau |
| 2012/0205315 A1 | 8/2012 | Liu et al. |
| 2012/0276657 A1 | 11/2012 | Joubert et al. |
| 2012/0315740 A1 | 12/2012 | Yao |
| 2013/0129922 A1 | 5/2013 | Sasagawa et al. |
| 2013/0137267 A1 | 5/2013 | Chang et al. |
| 2013/0168354 A1 | 7/2013 | Kanarik |
| 2014/0113457 A1 | 4/2014 | Sims et al. |
| 2014/0252486 A1 | 9/2014 | Lin et al. |
| 2014/0349469 A1 | 11/2014 | Sasagawa et al. |
| 2014/0363969 A1 | 12/2014 | Chen et al. |
| 2015/0037972 A1 | 2/2015 | Danek et al. |
| 2015/0111374 A1* | 4/2015 | Bao ................. H01L 21/30655 438/586 |
| 2015/0147871 A1 | 5/2015 | Xiao et al. |
| 2015/0155523 A1 | 6/2015 | Kamiya |
| 2015/0214474 A1 | 7/2015 | Nishimura et al. |
| 2015/0235835 A1* | 8/2015 | Swaminathan ... H01L 21/28194 438/778 |
| 2015/0243883 A1 | 8/2015 | Swaminathan et al. |
| 2015/0270140 A1 | 9/2015 | Gupta et al. |
| 2015/0299848 A1 | 10/2015 | Haukka et al. |
| 2015/0340225 A1 | 11/2015 | Kim et al. |
| 2015/0364372 A1 | 12/2015 | Chen et al. |
| 2015/0371896 A1 | 12/2015 | Chen et al. |
| 2016/0024647 A1 | 1/2016 | Saly et al. |
| 2016/0056074 A1* | 2/2016 | Na ................ H01J 37/32009 438/666 |
| 2016/0079521 A1* | 3/2016 | Draeger ................ H01L 43/12 438/3 |
| 2016/0126106 A1 | 5/2016 | Shimizu et al. |
| 2016/0203995 A1 | 7/2016 | Kanarik et al. |
| 2016/0280724 A1 | 9/2016 | Arkles et al. |
| 2016/0308112 A1 | 10/2016 | Tan et al. |
| 2016/0314985 A1 | 10/2016 | Yang et al. |
| 2016/0322213 A1 | 11/2016 | Thompson et al. |
| 2016/0376152 A1 | 12/2016 | Toutonghi |
| 2017/0029947 A1 | 2/2017 | Kawahara et al. |
| 2017/0029948 A1 | 2/2017 | Jongbloed et al. |
| 2017/0040214 A1 | 2/2017 | Lai et al. |
| 2017/0117159 A1 | 4/2017 | Kanarik et al. |
| 2017/0125256 A1 | 5/2017 | Lee et al. |
| 2017/0148642 A1 | 5/2017 | Wang et al. |
| 2017/0229314 A1 | 8/2017 | Tan et al. |
| 2018/0019387 A1 | 1/2018 | Tan et al. |
| 2018/0033635 A1 | 2/2018 | Kanarik et al. |
| 2018/0102236 A1 | 4/2018 | Yang et al. |
| 2018/0233349 A1 | 8/2018 | Smith et al. |
| 2018/0261447 A1 | 9/2018 | Smith et al. |
| 2018/0261448 A1 | 9/2018 | Smith et al. |
| 2018/0269058 A1 | 9/2018 | Smith et al. |
| 2018/0308695 A1 | 10/2018 | LaVoie |

FOREIGN PATENT DOCUMENTS

| | | |
|---|---|---|
| JP | 2013-079447 A | 5/2013 |
| JP | 5416280 B2 | 2/2014 |
| KR | 10-2017-0016310 A | 2/2017 |
| WO | 2011/081921 A2 | 7/2011 |
| WO | WO 2016/100873 | 6/2016 |
| WO | 2016/209570 | 12/2016 |

OTHER PUBLICATIONS

U.S. Office Action dated Mar. 29, 2018 issued in U.S. Appl. No. 15/719,484.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Notice of Allowance dated Jun. 30, 2017 issued in U.S. Appl. No. 14/749,291.
U.S. Notice of Allowance, dated Oct. 20, 2017, issued in U.S. Appl. No. 15/462,695.
U.S. Notice of Allowance, dated Oct. 23, 2017, issued in U.S. Appl. No. 15/456,301.

(56) References Cited

OTHER PUBLICATIONS

U.S. Notice of Allowance, dated Feb. 13, 2018, issued in U.S. Appl. No. 15/456,301.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
International Search Report and Written Opinion dated Jun. 25, 2018 issued in Application No. PCT/US2018/021823.
Chinese First Office Action dated Dec. 27, 2017 issued in Application No. CN 201610017911.4.
Singapore Search Report and Written Opinion dated Jun. 14, 2018 issued in Application No. SG 10201600099V.
Chinese First Office Action dated Jun. 26, 2018 issued in Application No. CN 201610255293.7.
Singapore Search Report and Written Opinion dated Jul. 9, 2018 issued in Application No. SG 10201603092R.
Chinese First Office Action dated Mar. 30, 2018 issued in Application No. CN 201610248296.8.
Singapore Search Report and Written Opinion dated Jun. 28, 2018 issued in SG 10201603090V.
Faraz et al., (2015) "Atomic Layer Etching: What Can We Learn from Atomic Layer Deposition?," *ECS Journal of Solid State Science and Technology*, 4(6):N5023-N5032.
Gottscho, Richard (Jul. 16, 2017) "Atomic Layer Etching—An Overview of Possibilities and Limitations," *Plenary Talk presented at American Vacuum Society 17th International Conference on Atomic Layer Deposition* (ALD 2017) *and 4th International Atomic Layer Etching Workshop* (ALE 2017), Lam Research Corp., 21pp.
Huang et al. (2017) "Design of efficient mono-aminosilane precursors for atomic layer deposition of $SiO_2$ thin films," *Royal Society of Chemistry Adv.* 2017, 7:22672-22678.
Kanarik et al. (Mar./Apr. 2015) "Overview of atomic layer etching in the semiconductor industry," *Vac. Sci. Technol. A*, 33(2):020802-1-020802-14.
Kanarik et al. (2017) "Predicting synergy in atomic layer etching," *J. Vac. Sci. Technol.* A,35(5):05C302-1 through 05C302-7.
Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.
Yokoyama et al. (1998) "Atomic-layer selective deposition of silicon nitride on hydrogen-terminated Si surfaces," *Applied Surface Science*, 130-132, 352-356.
U.S. Appl. No. 15/821,590, filed Nov. 22, 2017, Hausmann et al.
U.S. Appl. No. 15/878,349, filed Jan. 23, 2018, Smith et al.
U.S. Appl. No. 15/955,099, filed Apr. 17, 2018, LaVoie et al.
U.S. Appl. No. 15/975,554, filed May 9, 2018, Smith et al.
U.S. Office Action, dated Nov. 16, 2017, issued in U.S. Appl. No. 15/432,634.
U.S. Final Office Action dated May 3, 2018 issued in U.S. Appl. No. 15/432,634.
U.S. Office Action, dated Feb. 8, 2018, issued in U.S. Appl. No. 15/453,815.
Dangerfield et al. (2016) "Role of Trimethylaluminum (TMA) for Low Temperature $SiN_x$ Deposition: Growth Dependence on Number of TMA Exposures," ALD Conference 2016, 14pp.
Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.
Li et al. (2014) "LowTemperature (LT) Thermal ALD Silicon Dioxide Using Ozone Process," *Arradiance Inc.*, Sudbury, MA USA, 1 page.
Liu et al. (Jun. 26-29, 2011) "High Rate Growth of $SiO_2$ by Thermal ALD Using Tris(di-methylamino)silane and Ozone," ALD 2011, *Cambridge NanoTech Inc.*, Cambridge, MA, USA, 14pp.

Putkonen et al. (2014) "Thermal and plasma enhanced atomic layer deposition of $SiO_2$ using commercial silicon precursors," *Thin Solid Films*, 558:93-98.
Sundstrom, (Dec. 2005) "Ozone as the Oxidizing Precursor in Atomic Layer Deposition," *Gas & Chemicals, MKS Instruments, Inc.*, Wilmington, MA, 4pp.
U.S. Appl. No. 15/432,634, filed Feb. 14, 2017, Smith et al.
U.S. Appl. No. 15/453,815, filed Mar. 8, 2017, Smith et al.
U.S. Appl. No. 15/456,301, filed Mar. 10, 2017, Smith et al.
U.S. Appl. No. 15/462,695, filed Mar. 17, 2017, Smith et al.
U.S. Notice of Allowance dated Sep. 6, 2018 issued in U.S. Appl. No. 15/432,634.
U.S. Notice of Allowance, dated Oct. 5, 2018, issued in U.S. Appl. No. 15/453,815.
U.S. Notice of Allowance, dated Sep. 25, 2018, issued in U.S. Appl. No. 15/975,554.
U.S. Office Action, dated Nov. 1, 2018, issued in U.S. Appl. No. 15/581,951.
U.S. Notice of Allowance dated Sep. 11, 2018 issued in U.S. Appl. No. 15/719,484.
U.S. Office Action dated Dec. 14, 2018 issued in U.S. Appl. No. 15/719,497.
U.S. Office Action dated Oct. 10, 2018 issued in U.S. Appl. No. 15/423,486.
Chinese Second Office Action dated Aug. 31, 2018 issued in Application No. CN 201610017911.4.
Chinese Second Office Action dated Dec. 27, 2018 issued in Application No. CN 201610248296.8.
Happich, J., et al., (2018) "Atomic layer etching yields 2.5nm wide FinFETs," eeNews Europe, pp. 1-4. [retrieved on Dec. 12, 2018] URL:http://www.eenewseurope.com/news/atomic-layer-etching-yields-25nm-wide-finfets#.
U.S. Appl. No. 16/206,915, filed Nov. 30, 2018, Smith et al.
U.S. Appl. No. 16/247,296, filed Jan. 14, 2019, Smith et al.
U.S. Office Action dated Jun. 17, 2016 issued in U.S. Appl. No. 14/696,254.
U.S. Notice of Allowance dated Oct. 14, 2016 issued in U.S. Appl. No. 14/696,254.
U.S. Office Action dated May 5, 2016 issued in U.S. Appl. No. 14/749,285.
U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Nov. 28, 2016 issued in U.S. Appl. No. 14/749,291.
Boullart et al. (Mar. 29, 2013) "STT MRAM patterning challenges," *Proc. SPIE , Advanced Etch Technology for Nanopatterning II, Proc. of SPIE* 8685:86850F-1-86850F-9 [Retrieved on Jun. 2, 2015 from http://proceedings.spiedigitallibrary.org].
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.
Lee et al. (2015) "Atomic Layer Etching of $Al_2O_3$ Using Sequential, Self-Limiting Thermal Reactions with $Sn(acac)_2$ and Hydrogen Fluoride," $^{ACS}$NANO,9(2):2061-2070.
Pomeroy, R.K. and Wijesekera, K.S. (1980) "Preparation and derivatives of cis-$M(CO)_4(SiCl_3)_2$ (M = FE, RU, OS)," *Inorg. Chem.*, 19(12):3729-3735.
Puurunen, Rikka L. (2005) "Surface chemistry of atomic layer deposition: A case study for the trimethylaluminum/water process," *Journal of Applied Physics*, 97:121301-51 pages.
Schmitt et al. (2006) "Synthesis and Properties of Single-Crystal FeSi Nanowires," *Nano Lett.*, 6(8):1617-1621.

(56) References Cited

OTHER PUBLICATIONS

Schmitt et al. (Feb. 1, 2008) "Chemical Synthesis and Magnetotransport of Magnetic Semiconducting $Fe_{1-x}$-$Co_x$Si Alloy Nanowires," *Nano Lett.*, 8(3):810-815.

Wolf, S. and Tauber, R.N. (1986) "Silicon Processing for the VLSI Era," vol. I—*Process Technology, Lattice Press,* pp. 542-557.

Chabal* et al. (2016) "Atomic Layer Deposition of Silicon Dioxide Using Aminosilanes Di-sec-butylaminosilane and Bis(tert-butylamino)silane with Ozone," *The Journal of Physical Chemistry C*, ACS Publications, American Chemical Society, 120:10927-10935.

Chen, Rong and Bent*. Stacey F. (2006) "Chemistry for Positive Pattern Transfer Using Area-Selective Atomic Layer Deposition," *Adv. Mater.*, 18:1086-1090.

Chen et al. (2011) "Ozone-Based Atomic Layer Deposition of Crystalline $V_2O_5$ Films for High Performance Electrochemical Energy Storage," *Chemistry of Materials,* ACS Publications, American Chemical Society, 7pp.

\* cited by examiner

SELECTIVE DEPOSITION WITH ATOMIC LAYER ETCH RESET

CROSS-REFERENCE TO RELATED APPLICATION

This application claims the benefit of priority under 35 U.S.C. § 119(e) to U.S. Provisional Application No. 62/487,411, titled "SELECTIVE DEPOSITION WITH ATOMIC LAYER ETCH RESET," filed Apr. 19, 2017, all of which is incorporated herein by this reference and for all purposes.

BACKGROUND

As semiconductor substrate feature sizes shrink, there is a growing need for processing techniques to assist device shrinking and enable three-dimensional architectures. Atomic scale processing such as atomic layer deposition (ALD), atomic layer etch (ALE) have been found to be useful techniques in this regard. However, challenges to continued semiconductor device miniaturization and defect reduction remain.

SUMMARY

Provided are methods for conducting a deposition on a semiconductor substrate by selectively depositing a material on the substrate. The substrate has a plurality of substrate materials, each with a different nucleation delay corresponding to the material deposited thereon. Specifically, the nucleation delay associated with a first substrate material on which deposition is intended is less than the nucleation delay associated with a second substrate material on which deposition is not intended according to a nucleation delay differential, which degrades as deposition proceeds. A portion of the deposited material is etched to reestablish the nucleation delay differential between the first and the second substrate materials. The material is further selectively deposited on the substrate.

The etching may be performed in cycles, where a cycle includes: exposing a substrate to an etching gas to modify the surface of the substrate; and exposing the substrate to a removal gas to remove at least some of the modified surface. Exposing the substrate to the etching gas may further include igniting a plasma. In some embodiments, the method further includes applying a bias to the substrate. The etching gas may be a chlorine-containing compound. In various embodiments, a cycle etches between about 1 Å to about 50 Å of deposited material and/or film. The chamber may be purged between exposures.

A deposition cycle may include: exposing the substrate to a deposition precursor to modify the surface of the substrate; and exposing the substrate to a reducing agent to deposit the film. In some embodiments, the method further includes igniting a plasma. In some embodiments, at least some of the deposition precursor adsorbs onto the surface of the substrate during the exposing of the substrate to the deposition precursor. The chamber may be purged between exposures.

In some embodiments, the etching and the depositing is performed in the same chamber. The etching may be performed nonconformally. In some embodiments, at least one of the etching or the depositing is a self-limiting reaction.

Another aspect involves a method including: (a) exposing a substrate housed in a chamber to alternating pulses of a first reactant and a second reactant to deposit a film over the substrate, the substrate having a first substrate material on which deposition of the film is intended and a second substrate material on which deposition of the film is not intended, the second substrate material being different from the first substrate material, and the nucleation delay for the first substrate material being less than the nucleation delay for the second substrate material according to a nucleation delay differential, which degrades upon proceeding with the deposition; (b) exposing a substrate housed in a chamber to alternating pulses of an etching gas and a removal gas to etch a portion of the deposited material to reset the nucleation delay differential between the first and second substrate materials. In some embodiments, (a) and (b) may be performed in the same chamber, without breaking vacuum. In some embodiments, (a) and (b) may be repeated until sufficient net deposition has occurred.

The removal gas may be a carrier gas selected from the group consisting of $N_2$, Ar, He, and Ne. In some embodiments, (a) and (b) are performed in the same chamber and are performed sequentially. Furthermore, the chamber may be purged between pulses. In various embodiments, (a) further includes applying a bias to the substrate. In some embodiments, the method also includes igniting a plasma when exposing the substrate to the removal gas. The method may also include igniting a plasma when exposing the substrate to the second reactant.

In various embodiments, at least one of (a) or (b) is a self-limiting reaction. In some embodiments, (a) and (b) are repeated to deposit material on the substrate. In some embodiments, (a) and (b) are repeated to etch a film on the substrate. In various embodiments, the substrate is selected from the group consisting of metals and dielectrics.

Another aspect involves an apparatus for processing substrates, the apparatus including: one or more process chambers, each process chamber having a chuck; one or more gas inlets into the process chambers and associated flow-control hardware; and a controller having a processor and a memory, wherein the processor and the memory are communicatively connected with one another, the processor is at least operatively connected with the flow-control hardware, and the memory stores computer-executable instructions for controlling the processor to at least control the flow-control hardware by: selectively depositing a material on a semiconductor substrate, the substrate comprising a plurality of substrate materials having different nucleation delays corresponding to the material deposited thereon according to a nucleation delay differential; etching a portion of the material deposited on the substrate to reestablish the nucleation delay differential between the substrate materials; and further selectively depositing the material on the substrate.

Another aspect involves an apparatus for processing substrates, the apparatus including: one or more process chambers, each process chamber having a chuck; one or more gas inlets into the process chambers and associated flow-control hardware; and a controller having a processor and a memory, wherein the processor and the memory are communicatively connected with one another, the processor is at least operatively connected with the flow-control hardware, and the memory stores computer-executable instructions for controlling the processor to at least control the flow-control hardware by: exposing a substrate housed in a chamber to alternating pulses of a first reactant and a second reactant to deposit a film over the substrate, the substrate having a first substrate material on which deposition of the film is intended and a second substrate material on which deposition of the film is not intended, the second substrate material being different from the first substrate material, and the nucleation delay for the first substrate material being less than the nucleation delay for the second substrate material according to a nucleation delay differential, which degrades upon proceeding with the deposition; exposing a substrate housed in a chamber to alternating pulses of an etching gas and a removal gas to etch a portion of the deposited material to reset the nucleation delay differential between the first and second substrate materials.

These and other aspects are described further below with reference to the appended drawings.

DETAILED DESCRIPTION

Figure 1:
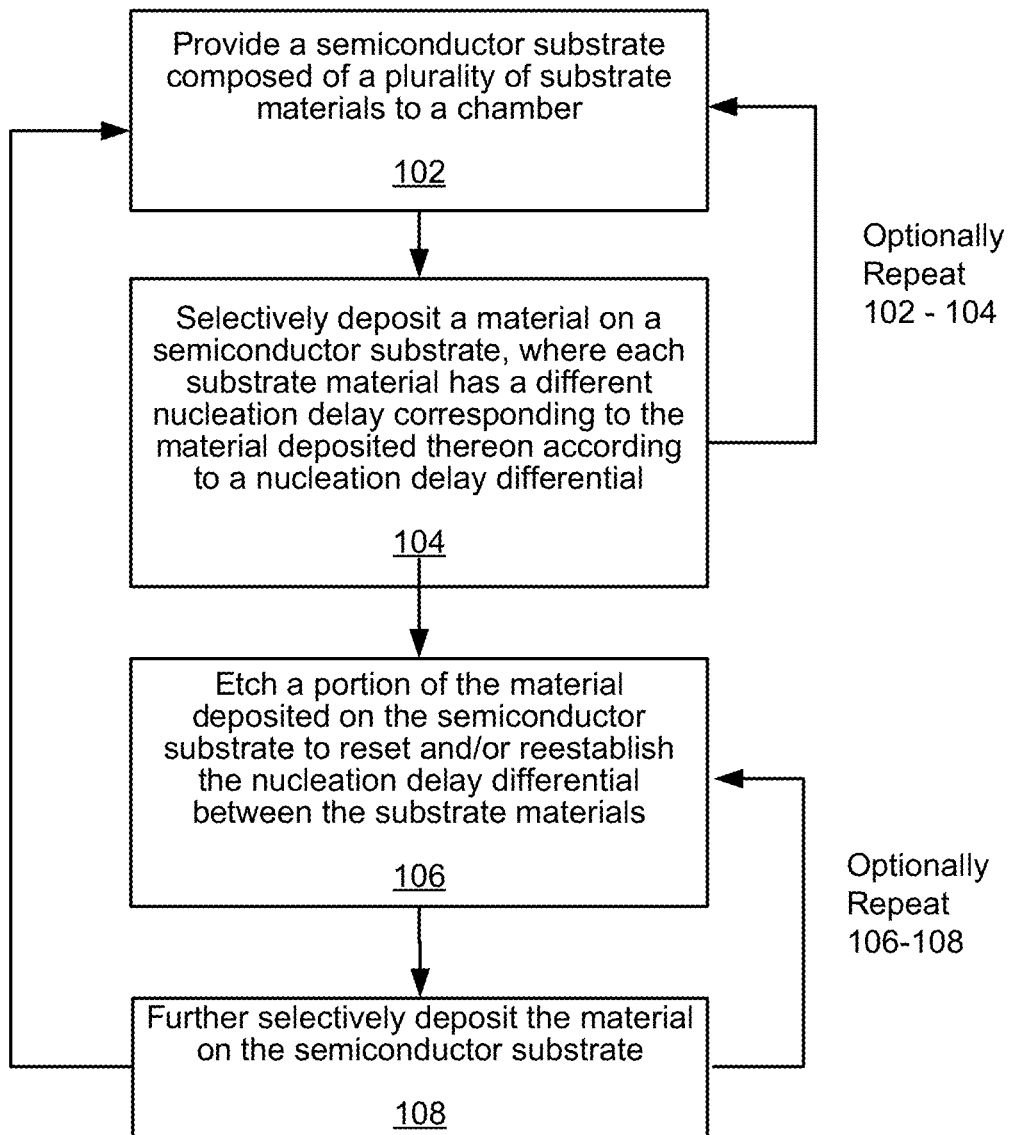
FIG. 1 is a process flow diagram depicting operations for a method in accordance with disclosed embodiments.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

As feature sizes shrink, there is a growing need for atomic scale processing such as Atomic Layer Deposition (ALD) and Atomic Layer Etch (ALE). These are cyclic processes of nominally self-limiting steps that result in digital and small changes in film thicknesses. The processes are characterized by relative smoothness and conformality, as well as directionality in certain ALE processes.

Methods provided herein relate to the combination of optimized selective deposition processes with controlled etching, such as ALE, to retain growth selectivity and improve upon defect elimination performance during the selective deposition process.

Selective deposition on a semiconductor substrate may be accomplished by periodically alternating between ALD and ALE processes. Selective deposition enables the continued device miniaturization and fabrication of various three-dimensional (3D) architectures by building, for example, a wafer upward from the bottom thereof. Additional advantages for selective deposition include, but are not otherwise limited to: simplified integration flows (i.e., without requiring separate lithography and/or etch processes), enhanced feature density and/or scaling (i.e., such that additional device features may be included in a smaller cross-sectional area) and patterning (i.e., improved overlay).

However, currently available methods for selective deposition are often material and/or system specific, thus no generalized approach to deposit metal and/or dielectric materials selectively at will exists. Other challenges otherwise associated with selective deposition are the creation of defects and the need for of a relatively narrow process window. Deposition selectivity may also deteriorate as deposition proceeds, since typical deposition processes are limited in their ability to assess nucleation delay and/or inability to grow materials selectively. Further, such deterioration of deposition selectivity makes relatively thicker film growth via selective deposition relatively difficult.

Moreover, selective deposition may result in defects due to a lack of precise and/or ideal starting surface (i.e., semiconductor substrate and/or wafer), such that residual deposition materials may be formed and/or otherwise found on such undesirable surface as defects.

Disclosed methods provide selective deposition processes to obtain differential growth dependent upon, or otherwise by using, the nucleation delay differential observed between the respective nucleation delays of, for example, two or more different substrate materials. That is, deposition processes are tailored to achieve selective deposition on, for example, a first substrate material relative to a second substrate material by leveraging the fact that deposition of the material being deposited occurs more readily on the first substrate material than on the second substrate material. The substrate on which the deposition selectively occurs has a lower or lesser nucleation delay for the material being deposited than the substrate material on which the deposition selectively does not occur, such that there is a difference between the nucleation delays associated with each of the two substrate materials, that difference referred to as the nucleation delay differential. It has been found, however, that deterioration of deposition selectivity occurs as selective deposition proceeds. To rectify this, it has been found that highly controlled ALE processes can be used in combination with the growth process to reset and/or reestablish the nucleation delay differential, allowing for the subsequent expansion of an otherwise limited process window as related to industrial applications.

Additional benefits of combining selective deposition with controlled etching, such as ALE, include the elimination of growth defects inherent to selective deposition, such as undesirable residual metal accumulated on a dielectric, or similar, substrate material, to be removed during ALE. Moreover, the disclosed methods assist in the generalization of selective deposition schemes to deposit materials and/or dielectrics selectively at will by enhancing and/or otherwise optimizing nucleation delays and/or a differential (i.e., a nucleation delay differential) observed between the nucleation delays specific to substrate materials. The disclosed methods also allow for selective deposition to occur more than once on the same substrate.

The disclosed methods provide a controllable solution to expand the otherwise relatively narrow process window in which selective deposition typically takes place. As discussed above, an initial selective deposition is conducted on a substrate composed of a plurality of substrate materials, in which the deposition selectively occurs on a substrate material having a lower or lesser nucleation delay than another substrate material on which the deposition selectively does not occur. In some embodiments, the nucleation delays associated with various substrate materials composing a substrate may be enhanced by using optimized chemistries, i.e., as a way to effectuate surface chemical changes, inhibition, etc., to ensure differential growth and to potentially expand the application window. Next, to enhance deposition selectivity and thereby improve throughput while decreasing defects associated with off-target deposition, a controllable etching process, such as ALE, is applied to the substrate to reset, restore and/or otherwise reestablish the nucleation delay and/or inhibition for a particular substrate material upon which deposition is sought.

By reset, restore or reestablish it is meant that the nucleation delay for the referenced material is decreased, generally substantially decreased, to at or near the level at the start of the selective deposition, for example at or within 1, 2, 5, 10, 20, 30, 40, 50, 60 70, 80 or 90% of the level of nucleation delay at the start of the selective deposition. In some instances, the nucleation delay may be decreased beyond the level (less than) that at the start of the selective deposition. In other embodiments, the nucleation delay differential may be enhanced by increasing the nucleation delay associated with the substrate material on which the deposition selectively does not occur, for example to the same or similar extent as described above with respect to the nucleation delay decrease. In other embodiments, both a decrease and an increase in the nucleation delays associated with the materials on which the deposition selectively does and does not occur, respectively, may be used to enhance the nucleation delay differential.

Thus, after completion of the ALE process, selectivity for deposition on various substrates (nucleation delay differential between various substrates) is expected to increase.

The methods provided herein offer solutions for inherent defects resultant from the selective deposition process, such as those resultant from residual deposition material found on, for example, undesirable non-growth surfaces. Usage of ALE in combination with selective deposition allows for the removal of such residual deposition material from undesirable surfaces to, for example, create better separation between metal and dielectric areas, as well as within various dielectric and metal sections. Thus, selective deposition schemes may thus cycle, for example, ALD and ALE steps on the same semiconductor substrate to deposit metals and/or dielectrics at will by enhancing and/or optimizing the nucleation delay differential between different substrate materials.

FIG. 1 provides a process flow diagram for performing operations in a method in accordance with disclosed embodiments. Operations in FIG. 1 may be performed at, for example, a chamber pressure between about 1 mTorr and about 100 Torr, e.g., about 1 mTorr and about 1 Torr. The method shown in FIG. 1 generally relates to conducting a deposition on a semiconductor substrate. Specifically, at operation 102, a semiconductor substrate composed of, or otherwise comprising, a plurality of distinct substrate materials is provided to a processing chamber.

Referring to the chamber in which the semiconductor substrate is provided in operation 102, the chamber may be a chamber in a multi-chamber apparatus or a single-chamber apparatus. The semiconductor substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a blanket layer of silicon, such as amorphous silicon, or a blanket layer of germanium. The substrate may include a patterned mask layer previously deposited and patterned on the substrate. For example, a mask layer may be deposited and patterned on a substrate including a blanket amorphous silicon layer.

In some embodiments, the layers on the substrate may be patterned. Substrates may have "features" such as via or contact holes, which may be characterized by one or more of narrow and/or reentrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the features may have aspect ratios of at least about 2:1, at least about 4:1, at least about 6:1, at least about 10:1, at least about 30:1, or higher. Protection of feature sidewalls may be desirable at high aspect ratios. Disclosed methods may be performed on substrates with features having an opening less than about 150 nm. A feature via or trench may be referred to as an unfilled feature or a feature. A feature that may have a reentrant profile that narrows from the bottom, closed end, or interior of the feature to the feature opening. In some embodiments, the methods described herein may be used to form features having these characteristics.

Next, at operation 104, a material is selectively deposited, for example as described with reference to FIG. 3 below, on one or more substrate materials of the semiconductor substrate, where the substrate materials have different nucleation delays corresponding to the material deposited thereon according to a nucleation delay differential. For example, deposition by, for example, ALD, of aluminum nitride (AlN) on a metal, such as tungsten (W) substrate may result in a different nucleation delay observed than the deposition of AlN on, for example a dielectric substrate such as $SiO_2$. This nucleation delay differential can be used to achieve selective deposition on the material with the lesser nucleation delay relative to the material with the greater nucleation delay.

Generally, ALD is a technique that deposits thin layers of material using sequential self-limiting reactions. ALD may be performed using any suitable technique. In various embodiments, ALD may be performed with plasma, or may be performed thermally. Also, operation 104 may be performed in cycles, i.e. referred to herein as an "ALD cycle."

The concept of an ALD cycle is relevant to the discussion of various embodiments herein. An ALD cycle, typically, is the minimum set of operations used to perform a surface deposition reaction one time. For example, the result of one successful ALD cycle is the production of at least a partial silicon-containing film layer on a desired substrate surface, such as the first substrate material of operation 104. Typically, an ALD cycle includes operations to deliver and adsorb at least one reactant to the substrate surface, to then react the adsorbed reactant with one or more reactants residing on the substrate surface to form, for example, at least a partial layer of film. The ALD cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a silicon-containing precursor, (ii) purging of silicon-containing precursor from the chamber, (iii) delivery of a second reactant and a plasma, and (iv) purging of plasma from the chamber.

In some embodiments, aluminum nitride (AlN) may be deposited on various substrates of interest via an ALD operation and/or cycle, such substrates including (but not limited to), the following: silicon oxide ($SiO_2$), silicon nitride ($Si_3N_4$), silicon carbide (SiC), aluminum oxide ($Al_2O_3$), and aluminum nitride (AlN). Also, AlN may be deposited on generic high-κ dielectric layers such as hafnium (Hf), zirconium (Zr) and tin oxide ($SnO_2$) and/or conducting films such as tungsten (W), copper (Cu), cobalt (Co), aluminum (Al), titanium (Ti), silicon (Si) and carbon (C) individually and/or in any combination.

Figure 3:
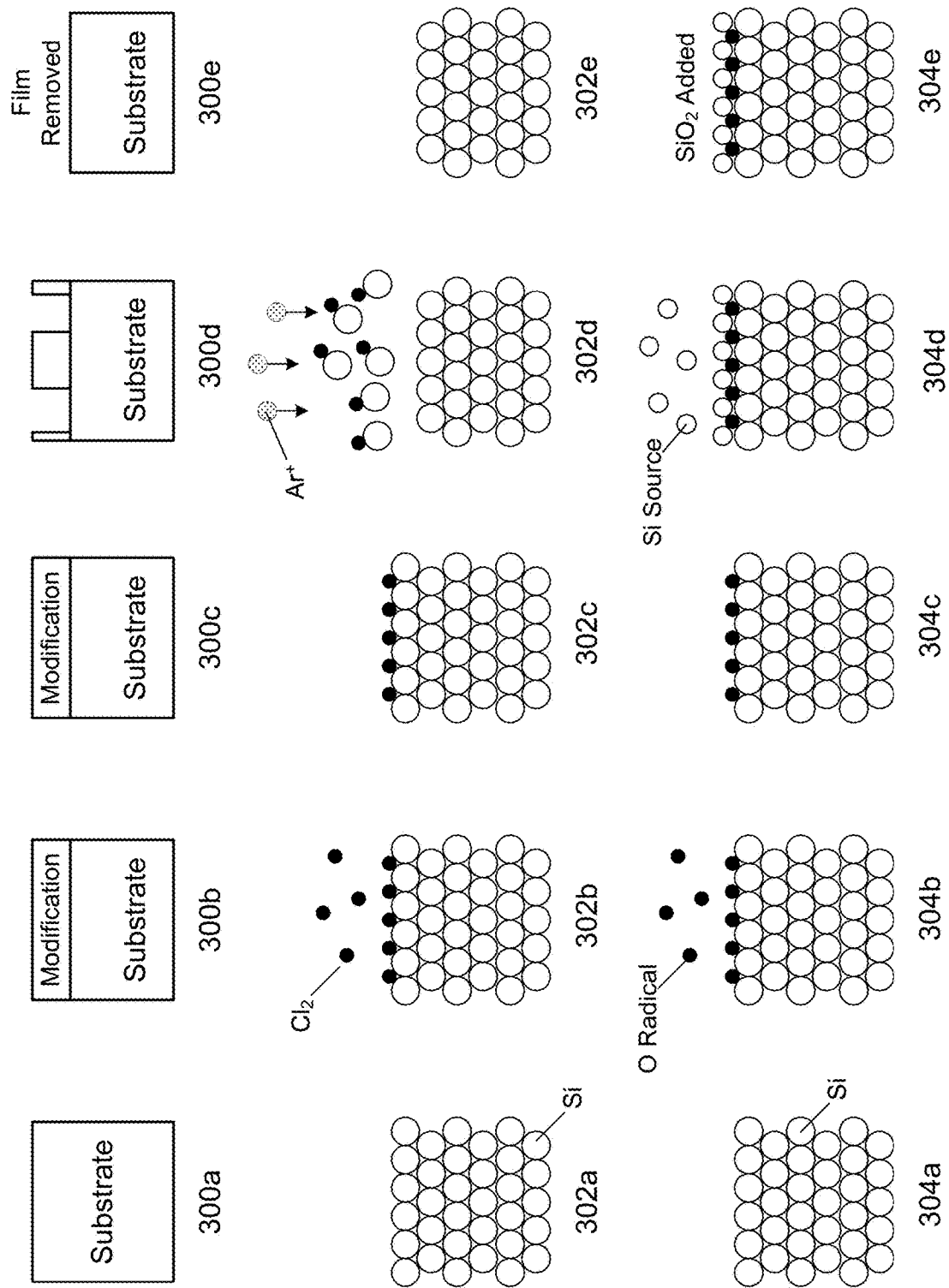
FIG. 3 is a schematic illustration of etch and deposition.

FIG. 3 shows an example schematic illustration of an ALD cycle for depositing silicon oxide ($SiO_2$). Diagrams 304a-304e show a generic ALD cycle. In 304a, a silicon substrate is provided, which includes many silicon atoms. In 304b, oxygen is introduced to the substrate as oxygen radicals, which modify the surface of the substrate. This may be the delivery of the reactant and plasma. Note some oxygen radicals are adsorbed onto the surface of the substrate as an example. In 304c, the oxygen radicals are purged from the chamber. In 304d, a silicon-containing precursor or silicon source is introduced and the silicon source reacts with the oxygen radicals adsorbed on the surface of the substrate. In 304e, the chamber is purged and the byproducts are removed, leaving behind a deposited layer of $SiO_2$.

Alternative to the selection of $SiO_2$ as a deposition material, in some embodiments, a metal such as aluminum (Al) and/or copper (Cu) is deposited via ALD on, for example, a first substrate surface on which deposition is intended during operation 104. In some embodiments, the first substrate surface may be comprised of substantially aluminum nitride (AlN). Moreover, trimethylaluminum ($Al_2(CH_3)_6$) may provide a suitable precursor to supply Al needed as a deposition material to, for example, deposit on a substrate substantially comprising AlN, where a subsequent nucleation delay is observed. Specifically, $Al_2(CH_3)_6$ maybe deposited in a relatively controlled manner from, for example, 250° C. to 350° C., above which decomposition is observed.

In some embodiments, the films deposited by ALD may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process chamber housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as an oxygen or nitrogen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation, such as when the second reactant is delivered to a chamber. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties. Additional examples of ALD processes are described in Puurunen, "Surface chemistry of atomic layer deposition: for the trimethylaluminum/water process", 97 J. Applied Physics 12301 (2005), which is herein incorporated by reference for the purpose of providing description for suitable ALD processes.

Specifically, in some embodiments, in operation 104, a thin film and/or material is deposited on a first semiconductor substrate material on which deposition is sought by, for example, ALD. In various embodiments, a silicon-containing material and/or film is deposited in operation 104. Example silicon-containing films include silicon oxide, silicon oxynitride and silicon nitride. In some embodiments, a metal or metal-containing film may be deposited. Moreover, in some embodiments, operation 104 may be performed prior to operation 106 to cycle through operations 102-108 as needed. Alternatively, in some embodiments, operation 106 may be performed prior to operation 104.

Further, in operation 104, in some embodiments, a carrier gas, such as $N_2$, Ar, Ne, He, and combinations thereof, may be continuously flowed. The carrier gas may be used as a purge gas. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

Provided herein is an example of adsorption and second reactant delivery operations that may be performed in operation 104. In an adsorption operation of an ALD cycle, a substrate on which ALD is intended may be exposed to a film precursor, such as silicon tetrachloride ($SiCl_4$), to adsorb onto the substrate surface. In some embodiments, the film precursor may be a silicon-containing precursor. In some embodiments, the film precursor, such as $SiCl_4$, may be adsorbed onto about 60% of the substrate surface. In various embodiments, when the film precursor is flowed to the chamber, the film precursor adsorbs onto active sites on the surface of the substrate, forming a thin layer of the film precursor on the surface. In various embodiments, this layer may be less than a monolayer.

After adsorption, the chamber may be optionally purged to remove excess precursor in gas phase that did not adsorb onto the surface of the substrate. Purging may involve a sweep gas, which may be a carrier gas used in other operations or a different gas. In some embodiments, purging may involve evacuating the chamber.

In a second reactant delivery operation of an ALD cycle, the substrate may be exposed to a second reactant and, optionally, a plasma. In various embodiments, the second reactant is oxygen ($O_2$) or nitrogen ($N_2$) or combinations thereof. In some embodiments where a silicon oxide layer is deposited, oxygen is used as the second reactant. In some embodiments, second reactant flow and the plasma are both turned on. In some embodiments, second reactant flow may be turned on prior to turning on the plasma to, for example, allow the second reactant flow to stabilize.

In some embodiments, the optional plasma is an in-situ plasma, such that the plasma is formed directly above the substrate surface in the chamber. In various embodiments, the plasma may be an inductively coupled plasma or a capacitively coupled plasma. A inductively coupled plasma may be set at a plasma between about 50 W and about 2000 W. In some embodiments, a bias may be applied between about 0V and about 500V. During delivery of the second reactant, the film precursor, such as $SiCl_4$, is turned off. The substrate may be exposed to the second reactant and the optional plasma for a duration that exceeds a time for plasma to interact with all precursors adsorbed on the substrate surface, forming a continuous film atop the substrate surface.

After the second reactant delivery operation, the chamber may be purged, such as by introducing a carrier or inert gas. Conditions for this operation may be any of those described above for purge processes.

In various embodiments, ALD cycles may be repeated. For example, operations for ALD may be performed for about 5 to about 70 cycles, even up to 300 cycles prior to substantial growth of the deposited film and/or layer of material. Thus, any suitable number of deposition cycles may be included and/or performed to deposit a desired film thickness of the deposited film. In some embodiments, an ALD cycle may deposit about 1 Å per cycle. Depending on the exposure time of the operations, each cycle may deposit a film, such as a silicon oxide or silicon oxynitride film, having a thickness between about 0.05 Å and about 5 Å. In some embodiments, about two to about three cycles of ALD may be performed per minute. In some embodiments, more than about three cycles may be performed per minute, such as in chambers with inlets positioned to be closer to the substrate.

In some embodiments, ALD operations produce conformal films capable of protecting the features from lateral etching in subsequent ALE processes, which may occur in the same chamber. In some embodiments, ALD is integrated to selectively deposit films on a substrate, such as to deposit films on corners of a feature to protect them from erosion during etching processes. In some embodiments, at least one of operation 104 and 106 is self-limiting reaction. In some embodiments, at least one of operation 104 and 106 is as self-limiting reaction as possible. For example, in some embodiments, only operation 106 is a self-limiting process. In some embodiments, only operation 104 is a self-limiting process. In some embodiments, both operations 104 and 106 are self-limiting. In various embodiments, operations 104 and 106 may be performed sequentially. Examples of sequentially performing these operations are further described below with respect to FIG. 3.

Figure 6:
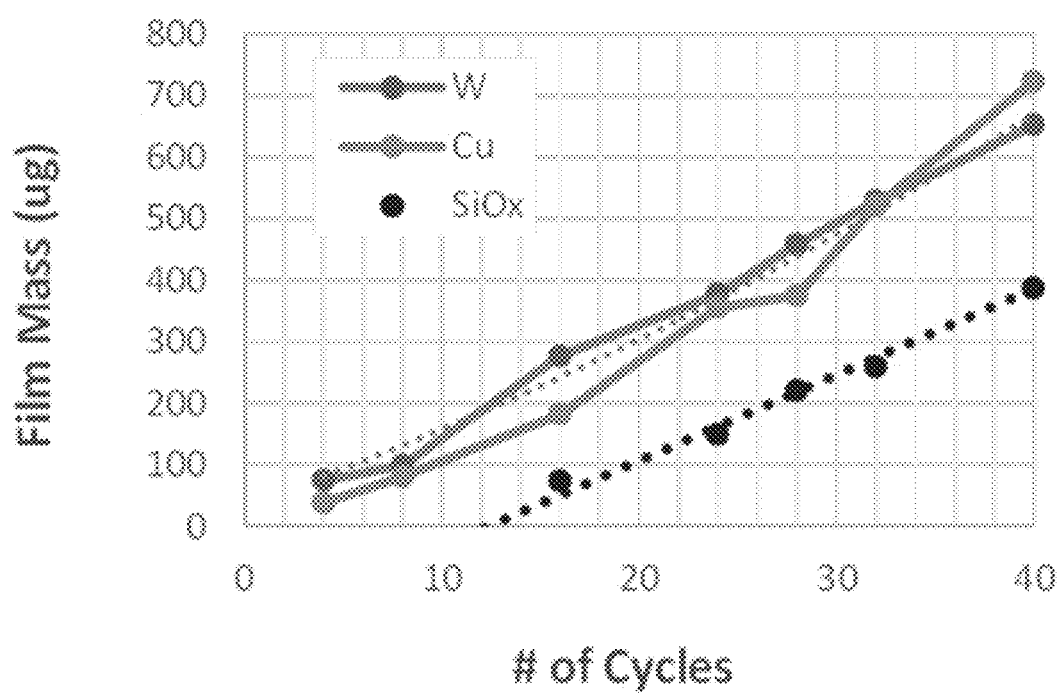
FIG. 6 is a plot of nucleation delay observed on a variety of substrate surfaces.

A nucleation delay, as further illustrated in FIG. 6, is observed at operation 104 as associated with the first substrate material. Specifically, as shown in FIG. 6, various substances, such as aluminum nitride (AlN) are deposited on a semiconductor substrate, which may be comprised substantially of metal, such as tungsten (W) or copper (Cu), silicon oxide ($SiO_2$), a dielectric such as hafnium (Hf), zirconium (Zr), or tin oxide ($SnO_2$). In some embodiments, as observed and shown in FIG. 6, deposition of aluminum (Al) from a trimethylaluminum ($Al_2(CH_3)_6$) precursor on any one or more of the above substrate materials may result in film mass growth.

As shown in FIG. 6, the nucleation delay observed between the two metals, i.e. W and Cu, is substantially less than between the metals and a dielectric, such as either W or Cu and $SiO_2$, for example. Further, observations of ALD in operation 104 may indicate that a metal substrate surface will generally catalyze the decomposition of a precursor faster than a dielectric surface.

Moreover, careful exposure and/or handling of the deposition material in a deposition chamber, i.e. to the material and/or substance to be deposited, such as aluminum (Al) derived from a trimethylaluminum ($Al_2(CH_3)_6$) precursor, may allow for the successful deposition of the material prior to its decomposition on, for example, a dielectric surface upon which deposition is sought. Nevertheless, in some embodiments, opposite nucleation behavior may be observed on a W or Cu surface that is fully reduced and/or at low temperatures. Also, $Al_2(CH_3)_6$ may be observed to tend to react in a predictable manner, or "cleanly," with hydroxyl-rich surfaces. Further, in some embodiments, desirable nucleation delays may be obtained via known methods, thus further discussion of such methods is omitted.

Further, in some embodiments, deposition may be selectively avoided, at operation 104, on a second substrate material of the semiconductor substrate on which deposition is not intended, i.e. in the same chamber as where deposition occurs on the first substrate material as substantially described earlier.

Following operation 104, a portion of the material deposited on the substrate is etched to reestablish the nucleation delay differential between the different substrate materials at operation 106. Specifically, in operation 106, the substrate is etched by ALE in the chamber. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

Operation 106, as shown in FIG. 1, may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and optional plasma, and (iv) purging of the chamber. In some embodiments, etching may be performed nonconformally.

After completion of etching as necessary at operation 106, material is further selectively deposited on the semiconductor substrate at operation 108, where such selective deposition typically benefits from enhanced deposition selectivity resultant from the successful completion of operations 104 and 106, etc.

In some embodiments, operations 102 and 104 may be optionally repeated as necessary, as may be operations 106 and 108. Further, operation 104 may be completed by ALD, while operation 106 may be completed by ALE, for example. Also, operations 102-108 may be repeated indefinitely until a desirable semiconductor feature profile is attained.

Further, in some embodiments, the nucleation delay associated with a first substrate material on which deposition is intended is less than a nucleation delay associated with a second substrate material on which deposition is not intended. And, in some embodiments, the nucleation delay differential degrades as deposition proceeds, i.e. upon completion of operation 104.

Figure 2:
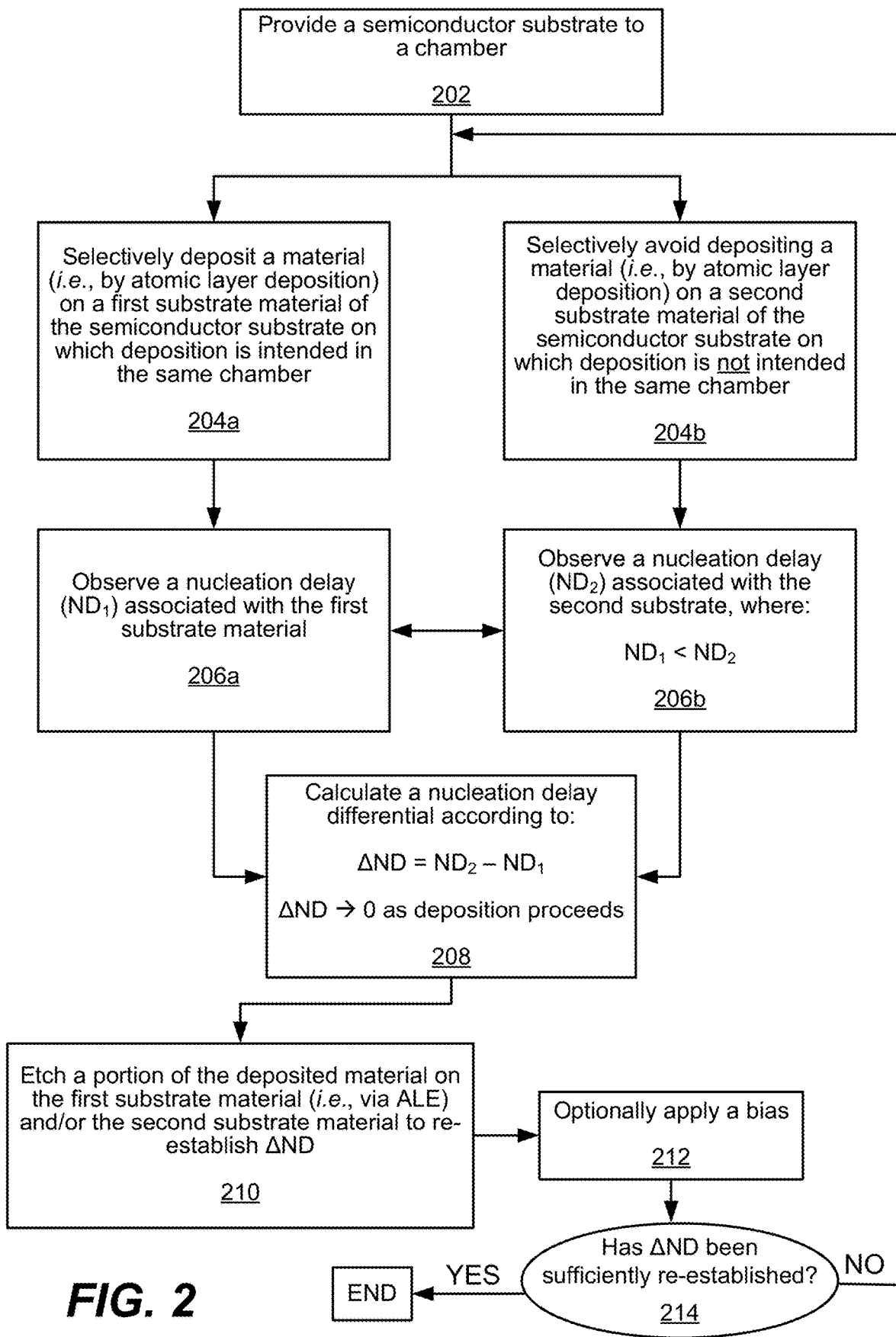
FIG. 2 is another process flow diagram depicting operations for a method in accordance with disclosed embodiments.

Referring now to FIG. 2, a process flow diagram for another embodiment of performing operations in a method as disclosed herein is shown. In some embodiments, the process flow illustrated by FIG. 2 may occur in substantially the same manner as the process flow shown by FIG. 1, thus a redundant description of the same is omitted.

Referring to operations 206a and/or 206b in FIG. 2, a nucleation delay $ND_1$, as further illustrated in FIG. 6, is observed at operation 206a as associated with the first substrate material.

Specifically, and as shown in FIG. 6, the nucleation delay observed between the two metals, i.e. W and Cu, is substantially less than between the metals and a dielectric, such as either W or Cu and $SiO_2$, for example. Further, observations of ALD in operation 204a, as conducted in operation 206a, may indicate that a metal substrate surface will generally catalyze the decomposition of a precursor faster than a dielectric surface.

Returning to FIG. 2, deposition may be selectively avoided, at operation 204b, on a second substrate material of the semiconductor substrate on which deposition is not intended, i.e. in the same chamber as where deposition occurs on the first substrate material as substantially described earlier. Accordingly, a nucleation delay $ND_2$ may be observed at operation 206b. In some embodiments, the nucleation delay $ND_1$ associated with ALD on the first substrate material may be lesser than the nucleation delay $ND_2$ associated with the second substrate material such that a nucleation delay differential, $\Delta ND$, may be calculated between $ND_2$ and $ND_1$ as shown in operation 208. Further, in some embodiments, $\Delta ND$ may approach zero (0) as ALD proceeds as shown in, for example, operation 204a.

Following the calculation of the nucleation delay differential, $\Delta ND$, in operation 208, a portion of the material deposited on the first substrate material at operation 204a and/or a portion of the material deposited on the second substrate material at operation 204b is etched by, for example ALE, to reset and/or otherwise reestablish $\Delta ND$.

In operation 210, the substrate is etched by, for example, the performance of one or more cycles of ALE in the chamber. FIG. 3 shows two example schematic illustrations of an ALE cycle, such as may be used to implement the processes illustrated in FIGS. 1 and 2. Diagrams 300a-300e show a generic ALE cycle. In 300a, the substrate is provided. In 300b, the surface of the substrate is modified. In 300c, the next step is prepared. In 300d, the modified layer is being etched. In 300e, the modified layer is removed. Similarly, diagrams 302a-302e show an example of an ALE cycle for etching a silicon film. In 302a, a silicon substrate is provided, which includes many silicon atoms. In 302b, reactant gas chlorine is introduced to the substrate which modifies the surface of the substrate. The schematic in 302b shows that some chlorine is adsorbed onto the surface of the substrate as an example. Although chlorine is depicted in FIG. 3, any chlorine-containing compound or suitable reactant may be used. In 302c, the reactant gas chlorine is purged from the chamber. In 302d, a removal gas argon is introduced with a directional plasma as indicated by the $Ar^+$ plasma species and arrows, and ion bombardment is performed to remove the modified surface of the substrate. During this operation, a bias is applied to the substrate to attract ions toward it. In 302e, the chamber is purged and the byproducts are removed.

A cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may depend on the purpose of integrating with ALD. For example, if ALD is integrated to protect the sidewalls, then the amount etched in ALE cycles may be varied such that performing ALD protects the exposed sidewalls at the bottom of the feature. In some embodiments, a cycle of ALE may remove less than a monolayer of material.

Etching chemistry is introduced into the chamber in operation 210 of FIG. 2. As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as $N_2$, Ar, Ne, He, and combinations thereof, is continuously flowed during operation 210. In some embodiments, a carrier gas is only used during removal. The carrier gas may be used as a purge gas in some operations as described below. In some embodiments, another reactant gas, such as oxygen, is used during operation 210 to remove a modified layer. In some embodiments, a carrier gas is not flowed during removal.

Provided herein is an example of modification and removal operations that may be performed in operations 106, shown in FIG. 1, and 210 shown in FIG. 2. The modification operation forms a thin, reactive surface layer with a thickness that is more easily removed than the un-modified material in the subsequent removal operation. In a modification operation, a substrate may be chlorinated by introducing chlorine into the chamber. Chlorine is used as an example etchant species in disclosed embodiments, but it will be understood that in some embodiments, a different etching gas is introduced into the chamber. The etching gas may be selected depending on the type and chemistry of the substrate to be etched. In some embodiments, a plasma may be ignited and chlorine reacts with the substrate for the etching process. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above. The species generated from a chlorine plasma can be generated directly by forming a plasma in the process chamber housing the substrate or they can be generated remotely in a process chamber that does not house the substrate, and can be supplied into the process chamber housing the substrate. In some embodiments, a plasma is not used and chlorine may be introduced thermally into the chamber.

In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 500V.

In some embodiments, a purge may be performed after a modification operation. In a purge operation, non-surface-bound active chlorine species may be removed from the process chamber. This can be done by purging and/or evacuating the process chamber to remove the active species, without removing the adsorbed layer. The species generated in chlorine plasma can be removed by simply stopping the plasma and allowing the remaining species decay, optionally combined with purging and/or evacuation of the chamber. Purging can be done using any inert gas such as $N_2$, Ar, Ne, He and their combinations.

In a removal operation, the substrate may be exposed to an energy source (e.g. activating or sputtering gas or chemically reactive species that induces removal), such as argon or helium, to etch the substrate by directional sputtering. In some embodiments, the removal operation may be performed by ion bombardment. During removal, a bias may be optionally turned on to facilitate directional sputtering. In some embodiments, ALE may be isotropic.

The amount of sputtering gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched. If the bias is turned on during removal, the bias may be set at about 50 eV for etching features, trenches, or holes in a soft material such as amorphous silicon. In some embodiments, the chamber may be purged after a removal operation. Purge processes may be any of those used for a purge after a modification operation.

In various embodiments, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

In some embodiments, the described ALD and ALE processes discussed herein may be performed in different chambers, with the substrate being transferred between the chambers without breaking vacuum. In other embodiments, the described ALD and ALE processes may be performed in the same chamber, with no vacuum break between deposition and etch operations.

Returning to FIG. 2, a bias is optionally applied at an operation 212. Applying a bias may etch sidewalls, so in various embodiments, a bias may not be applied continuously and may be applied after various cycles of ALD and ALE. This operation may be performed to break through the film deposited by ALD. In some embodiments, the bias is set to about 80 eV to break through the layer deposited by cycles of ALD.

Operation 214 determines whether sufficient reset and/or reestablishment of ΔND has been performed. If ΔND is not sufficiently reset, operations 204a and/or 204b-214 may be repeated. Further, in some embodiments operations 204a and/or 204b-214 are performed in the same chamber or without breaking vacuum for the repeated cycles as in the initial cycle.

Figure 4:
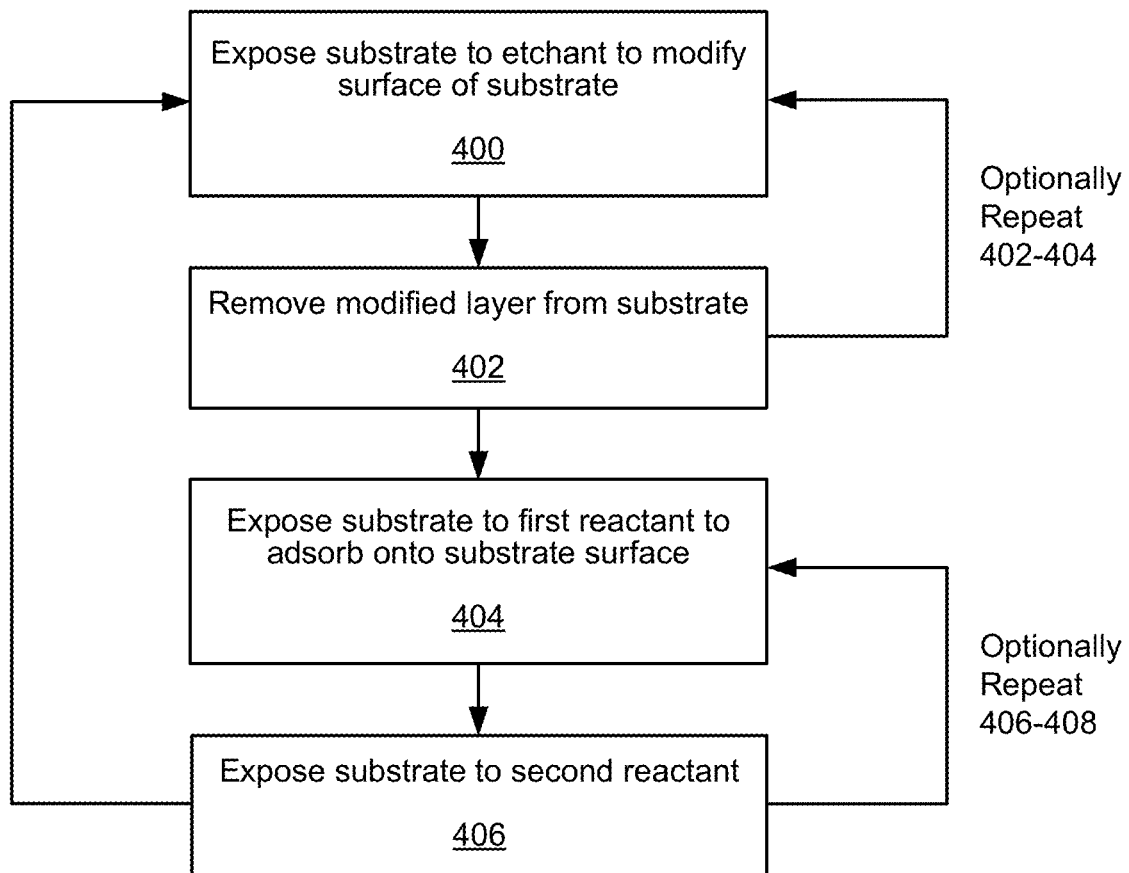
FIG. 4 is another process flow diagram depicting operations for a method in accordance with disclosed embodiments.

FIG. 4 provides further illustration of processes for implementing disclosed embodiments, combining ALE and selective ALD operations in a single process flow. In operation 400, a substrate housed in a chamber may be exposed to an etchant or etching gas to modify the surface of the substrate. This may be referred to as a "surface modification" operation. During this operation, a carrier gas may be optionally flowed, while an etchant is flowed to the chamber. A carrier gas may be any of the carrier gases described above with respect to FIGS. 1-3. In some embodiments, a carrier gas is not flowed during surface modification. The etchant may be flowed such that it modifies only the top surface of the substrate. In various embodiments, a bias may be applied during operation 400. The bias may be applied at a power between about 0V and about 500V.

Returning to FIG. 4, in operation 402, the modified layer of the substrate may be removed from the substrate by exposing the substrate to a sputtering gas in a removal operation, which may be the same as or different from a carrier gas. In various embodiments, at least part of the substrate surface may be etched in this operation. The example provided above with respect to operation 210, shown in FIG. 2, may be used in accordance with these operations. Performing operations 400 and 402 may, in some embodiments, constitute performing ALE once. In some embodiments, operations 400 and 402 may be optionally repeated one or more times (e.g., in one or more cycles).

Operation 402 may correspond to a removal phase. In some embodiments, a cycle may include more operations. During removal, a carrier gas may be flowed without flowing any other chemistry. The carrier gas may be flowed to help facilitate purging of the modified layer as it is etched.

In operation 404, the substrate is exposed to a first reactant to adsorb the first reactant onto at least some of the substrate surface. This operation may be performed without breaking vacuum from performing operations 400 and 402. In some embodiments, the first reactant is a film precursor as described herein. In various embodiments, the first reactant may adsorb onto active sites of the substrate. The above described examples of adsorption during an ALD cycle are relevant to this operation.

Operation 404 may correspond to first precursor exposure phase. During this operation, the first precursor may be flowed with an optional carrier gas. Note that during this operation, the etchant flow and second reactant flow to be described further below may not be flowed. This operation may be performed for a duration sufficient to saturate at least part of the surface of the substrate. In some embodiments, at least about 40%, or at least about 60%, or at least about 80%, or about 100% of the surface may be saturated.

In some embodiments, after performing the first precursor exposure phase, the chamber housing the substrate may be optionally purged in a purge phase. During the purge phase, a carrier gas is flowed to remove excess first precursor that did not adsorb onto the surface of the substrate. In some embodiments, the purge phase is not performed.

Returning to FIG. 4, operation 406 may be performed such that the substrate is exposed to a second reactant. In various embodiments, the second reactant may be a reducing agent. The second reactant reacts with the adsorbed layer to deposit a thin film on the substrate. Note that in some embodiments, operations 404 and 406 may be performed in reverse such that operation 406 is performed prior to adsorbing the first reactant onto the surface of the substrate.

Operation 406 may correspond to second reactant exposure phase. During this phase, the second reactant is flowed, and a carrier gas is optionally flowed. In some embodiments, a second reactant is flowed without a carrier gas. The etchant and first precursor flow are not turned on during this phase. In various embodiments, the second reactant exposure phase may also include igniting a plasma (not shown in the Figures). In some embodiments the thin layer of film may be deposited without use of a plasma. In some embodiments, the chamber is optionally purged after the second reactant exposure phase during the purge phase. The purge phase may be performed to remove byproducts or excess second reactant in gas phase from the chamber. In some embodiments, the chamber is not purged.

Operations 404 and 406 of FIG. 4 may be optionally repeated one or more times. Performing operations 404 and 406 may constitute an ALD cycle as described above with respect to FIG. 1A. In various embodiments, operations 400-406 are repeated one or more times. A combination of repeated cycles of operations 400 and 402, and repeated cycles of operations 404 and 406 may be performed in further cycles. For example, in some embodiments, a cycle may include performing operations 400-402 twice, and/or performing operations 404-406 three times, and may also be repeated two or more times. In some embodiments, cycles of operations 400-402 and operations 404-406 are performed sequentially. For example, after performing operations 400-402, operations 404-406 are performed, and/or vice versa. The frequency of cycles and the number of cycles used in a process may depend on the type of application disclosed embodiments are used for.

Figure 5:
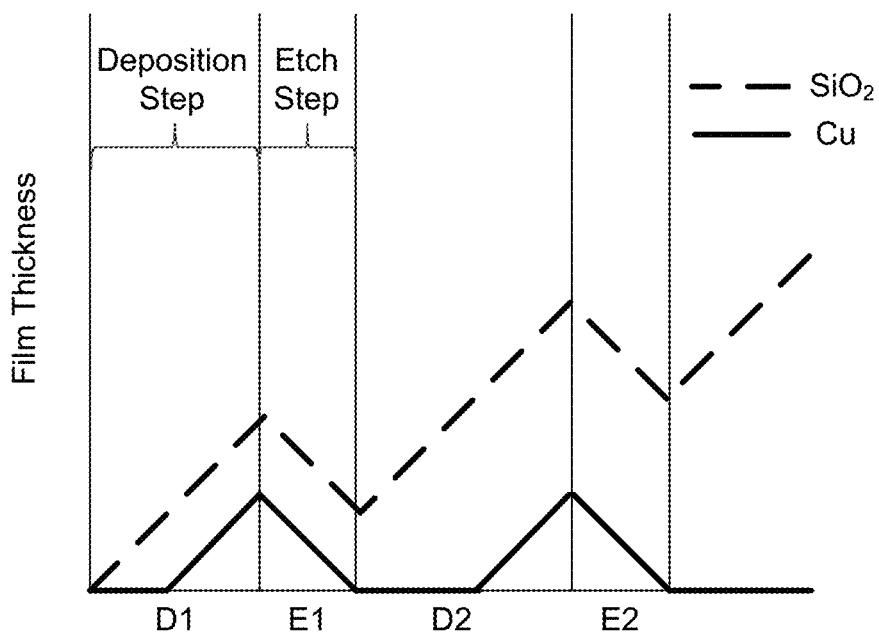
FIG. 5 is a plot of alternating deposition and etch cycles.

Referring to FIG. 5, a plot of film thickness evaluated against progressive alternating deposition, such as ALD completed in operation 204a of FIG. 2, and etch procedures, such as ALE completed in operation 210 of FIG. 2, is shown. Specifically, in some embodiments, aluminum nitride (AlN) may be deposited on either a dielectric, such as silicon dioxide ($SiO_2$), and/or a metal, such as copper (Cu), via ALD. Alternatively, in some embodiments, AlN, or other materials such as $SiO_2$ and/or Cu may be deposited on a substrate made of substantially aluminum nitride (AlN).

As shown in FIG. 5, deposition of AlN on either a substrate comprising $SiO_2$ or Cu results in, for example, distinct AlN film thickness growth patterns relative to the substrate upon which AlN is deposited, namely $SiO_2$ or Cu. The relative thickness of deposited materials and/or film, i.e. "film thickness," may progress substantially as shown, with rapid growth observed for AlN as deposited on a $SiO_2$ substrate. In contrast, film thickness growth of AlN deposited on a Cu substrate may, for example, remain stagnant for an initial period of time due to nucleation delays associated with such a deposition. A subsequent etch operation then reduces the film thickness the AlN deposited on either the $SiO_2$ substrate and/or the Cu substrate, with AlN film deposited on the Cu substrate returning and/or being reset to an initial zero thickness condition. Such deposition and etch operations and/or cycles may be repeated as desired to accomplish certain desirable film thicknesses of AlN on, for example, a $SiO_2$ substrate and/or Cu substrate, as discussed.

APPARATUS

Figure 7:
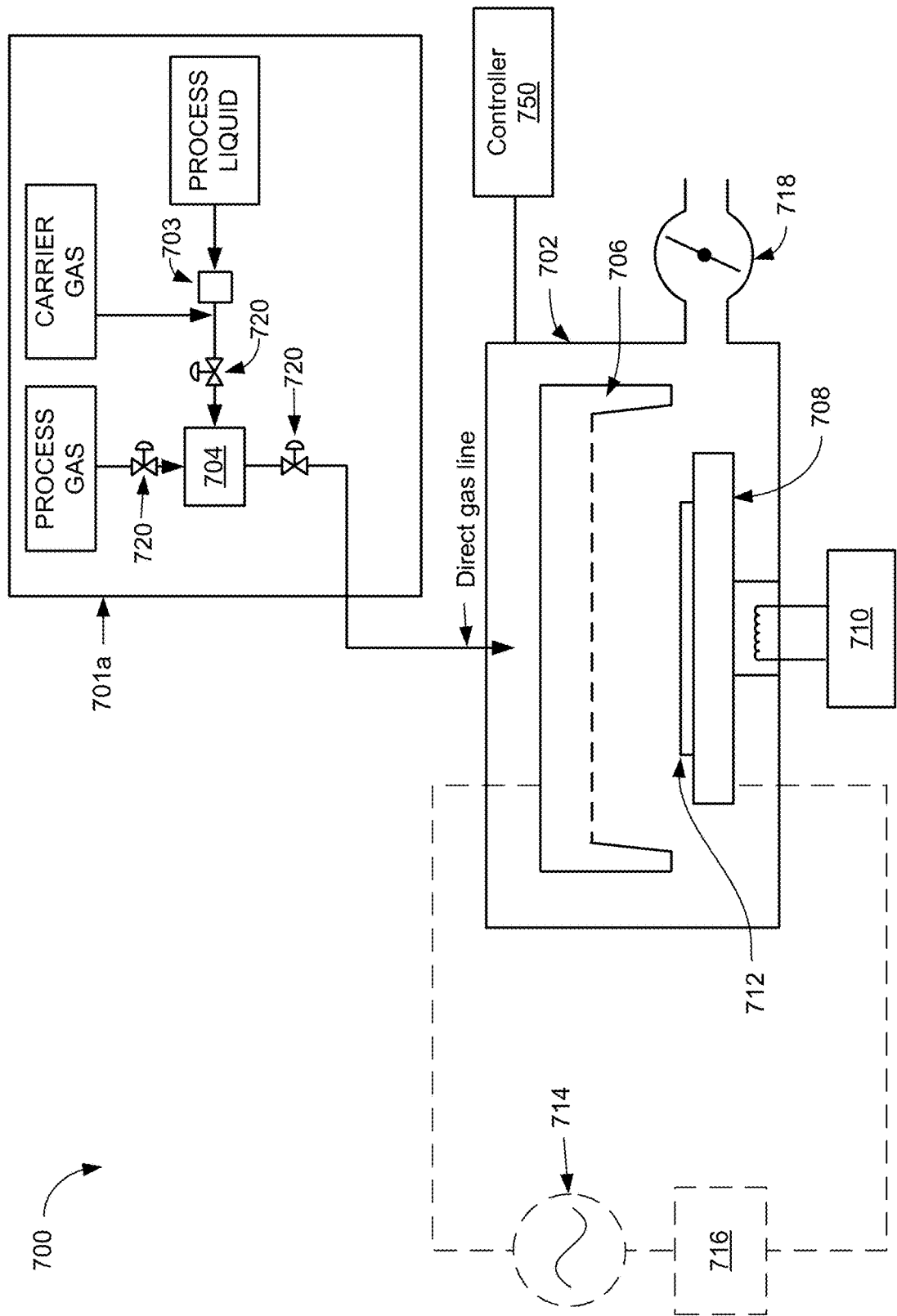
FIG. 7 is a schematic diagram of an example process chamber for performing disclosed embodiments.
Figure 8:
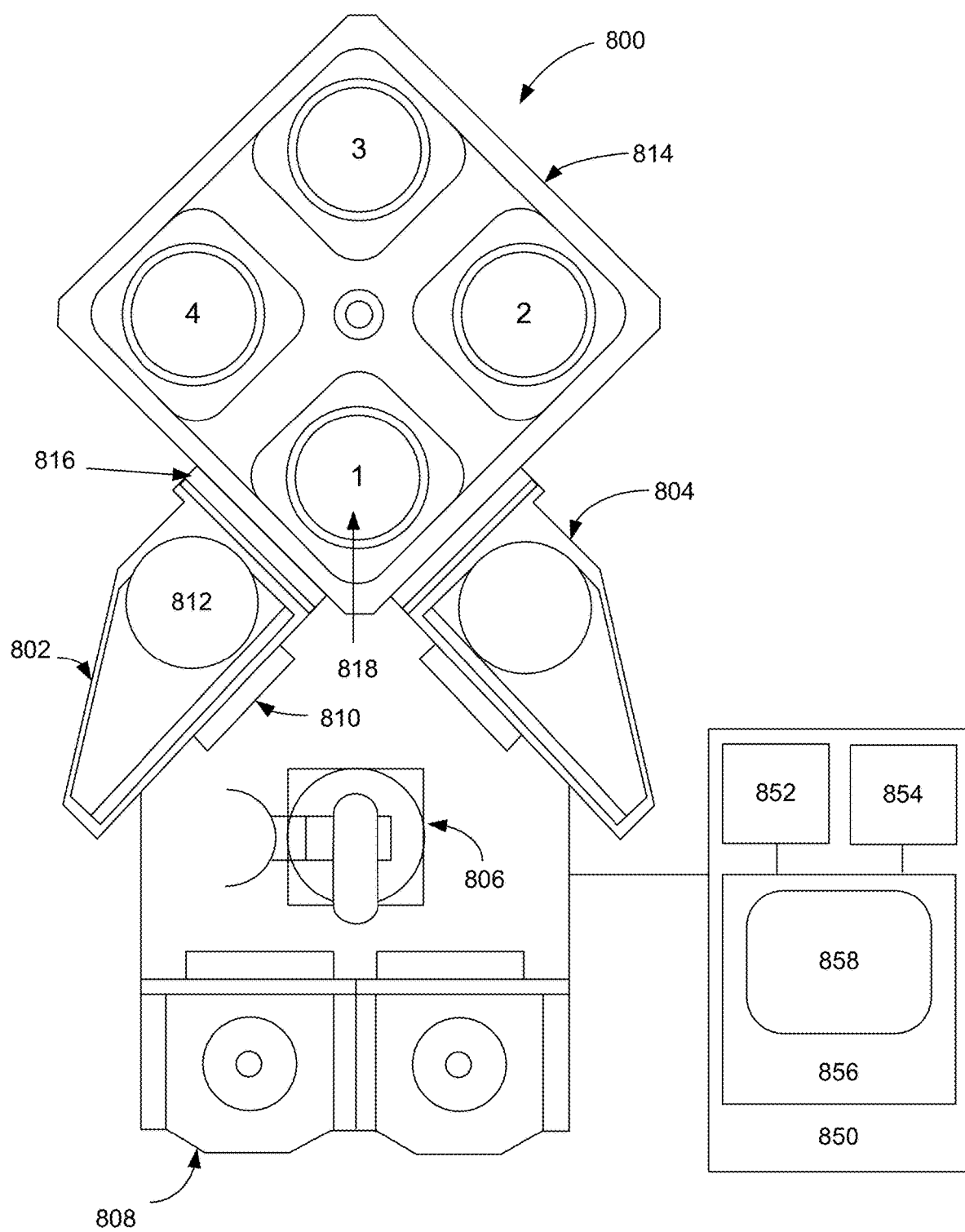
FIG. 8 is another schematic diagram of an example process chamber for performing disclosed embodiments.

FIG. 7 depicts a schematic illustration of an embodiment of an atomic layer deposition (ALD) process station 700 having a process chamber body 702 for maintaining a low pressure environment, suitable for conducting selective deposition as described herein. A plurality of ALD process stations 700 may be included in a common low pressure process tool environment. For example, FIG. 8 depicts an embodiment of a multi-station processing tool 800. In some embodiments, one or more hardware parameters of ALD process station 700 including those discussed in detail below may be adjusted programmatically by one or more computer controllers 750.

ALD process station 700 fluidly communicates with reactant delivery system 701a for delivering process gases to a distribution showerhead 706. Reactant delivery system 701a includes a mixing vessel 704 for blending and/or conditioning process gases, such as an aminosilane precursor gas, or oxidizing agent gas (e.g., ozone), or ammonia and/or nitrogen gas, for delivery to showerhead 706. One or more mixing vessel inlet valves 720 may control introduction of process gases to mixing vessel 704. Nitrogen plasma and/or ammonia plasma may also be delivered to the showerhead 706 or may be generated in the ALD process station 700.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non limiting example, piping downstream of vaporization point 703 has an increasing temperature profile extending from approximately 100° C. to approximately 150° C. at a mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750.

In another scenario, adjusting a height of pedestal 708 may allow a plasma density to be varied during plasma activation cycles in the process in embodiments where a plasma is ignited. At the conclusion of the process phase, pedestal 708 may be lowered during another substrate transfer phase to allow removal of substrate 712 from pedestal 708.

In some embodiments, pedestal 708 may be temperature controlled via heater 710. In some embodiments, the pedestal 708 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 700 may be provided by butterfly valve 718. As shown in the embodiment of FIG. 7, butterfly valve 718 throttles a vacuum provided by a downstream vacuum pump (not shown in the Figures). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are about 150 W to about 6000 W. Plasma may be used during treatment of a silicon nitride surface prior to selective deposition of silicon oxide on silicon oxide relative to silicon nitride. RF power supply 714 may provide RF power of any suitable frequency. In some embodiments, RF power supply 714 may be configured to control high- and low-frequency RF power sources independently of one another. Example low frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than about 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or an ammonia and/or nitrogen reactant gas, instructions for setting a flow rate of a carrier gas (such as argon), instructions for igniting a plasma, and time delay instructions for the first recipe phase. A second recipe phase may include instructions for setting a flow rate of an inert and/or aminosilane silicon precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of an oxidizing agent gas such as ozone, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 750 may include any of the features described below with respect to system controller 850 of FIG. 8.

As described above, one or more process stations may be included in a multi-station processing tool 800 as shown in FIG. 8. The multi-station processing tool may, in some embodiments, be from the VECTOR® family of tools and/or products available from Lam Research of Fremont, Calif., and conduct or otherwise assist with, ALD as presented and described in connection with FIGS. 1-3. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment to treat the silicon nitride surface in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

In some embodiments, that shown in FIG. 8 may interact and/or otherwise engage with a wafer handling system for transferring wafers within processing chamber 814. In some embodiments, the wafer handling system may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., aminosilane gases, and oxidizing agent gases, ammonia, nitrogen, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Figure 9:
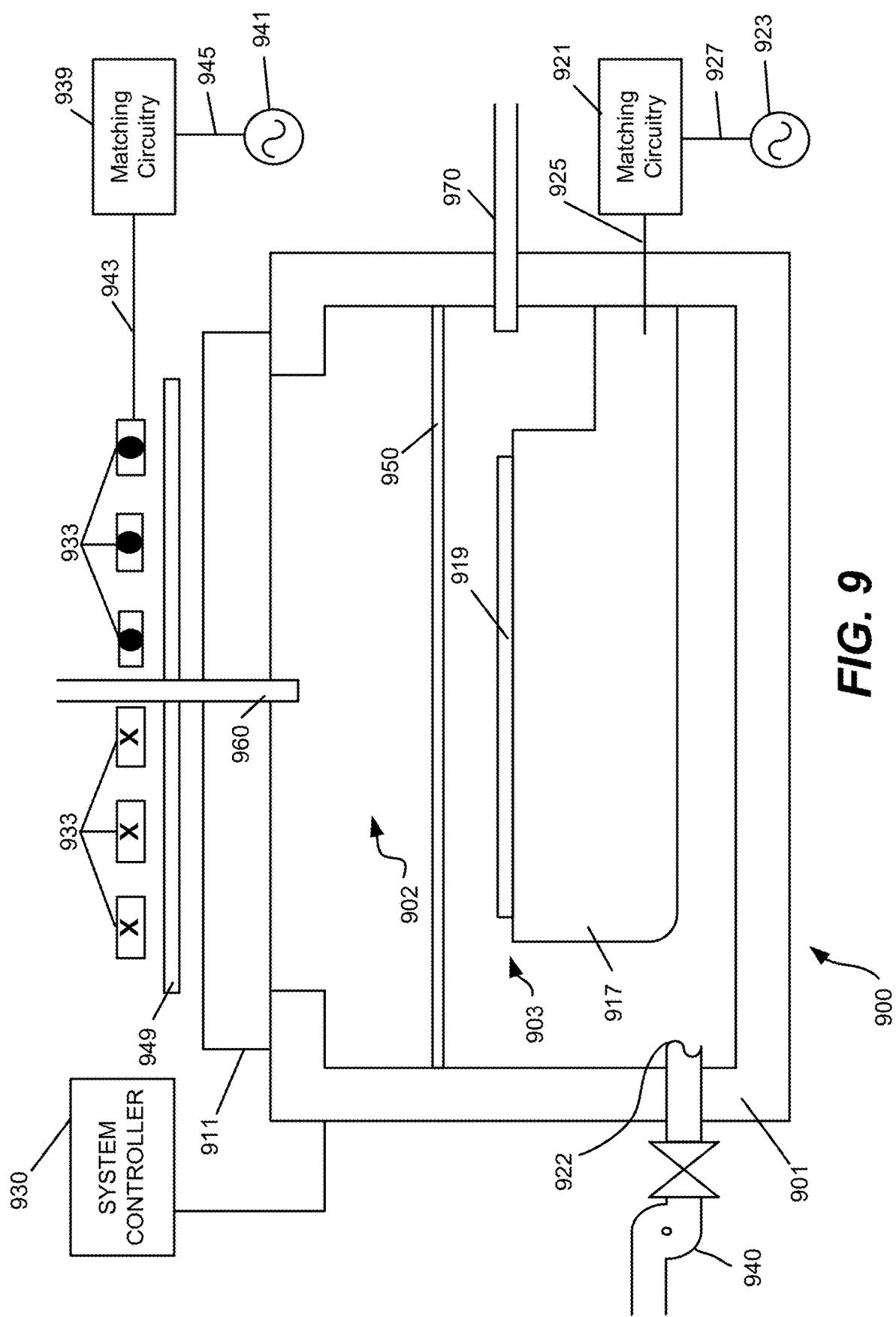
FIG. 9 is yet another schematic diagram of an example process apparatus for performing disclosed embodiments.

Referring generally to FIG. 9, inductively coupled plasma (ICP) reactors which, in certain embodiments, may be suitable for atomic layer etching (ALE) operations and/or atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma (CCP) reactors may also be used.

FIG. 9 schematically shows a cross-sectional view of an inductively coupled plasma integrated etching and deposition apparatus 900 appropriate for implementing certain embodiments herein, an example of which is a Kiyo™ reactor, produced by Lam Research Corp. of Fremont, Calif. In some embodiments, ALE as presented and described in connection with FIGS. 1-4, may be primarily conducted on the Kiyo™ reactor. The inductively coupled plasma apparatus 900 includes an overall process chamber structurally defined by chamber walls 901 and a window 911 extending lengthwise there between. The chamber walls 901 may be fabricated from stainless steel or aluminum. The window 911 may be fabricated from quartz or other dielectric material. An optional internal plasma grid 950 divides the overall processing chamber into an upper sub-chamber 902 and a lower sub-chamber 903 positioned beneath thereof. Further, in some embodiments, the plasma grid 950 may be removed, thereby creating and/or utilizing a chamber space made of both sub-chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some embodiments, an edge ring (not shown) surrounds the chuck 917, and has an upper surface that is approximately planar with a top surface of a wafer 919, when present over the chuck 917. In some embodiments, the chuck 917 also includes electrostatic electrodes for chucking and dechucking the wafer. A filter and DC clamp power supply (not shown in the Figures) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917.

Elements for plasma generation include a coil 933 is positioned above window 911. In some embodiments, a coil is not used in disclosed embodiments. The coil 933 is fabricated from an electrically conductive material and includes at least one complete turn. The example of a coil 933 shown in FIG. 9 includes three turns. The cross-sections of coil 933 are shown with symbols, and coils having an "X" extend rotationally into the page, while coils having a "●" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949 is positioned between the coil 933 and the window 911. The Faraday shield 949 is maintained in a spaced apart relationship relative to the coil 933. The Faraday shield 949 is disposed immediately above the window 911. The coil 933, the Faraday shield 949, and the window 911 are each configured to be substantially parallel to one another in, for example, the configuration shown in FIG. 9. The Faraday shield may prevent metal or other species from depositing on the dielectric window of the plasma chamber.

Process gases (e.g., chlorine, argon, silicon tetrachloride, oxygen, nitrogen, etc.) may be flowed into the processing chamber through one or more main gas flow inlets 960 positioned in the upper chamber and/or through one or more side gas flow inlets 970. Likewise, though not explicitly shown, similar gas flow inlets may be used to supply process gases to a capacitively coupled plasma (CCP) processing chamber. A vacuum pump, e.g., a one or two stage mechanical dry pump and/or turbomolecular pump 940, may be used to draw process gases out of the process chamber and to maintain a pressure within the process chamber. For example, the pump may be used to evacuate the chamber during a purge operation of ALD. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown in FIG.

9) or a pendulum valve (not shown in FIG. 9), during operational plasma processing. Likewise, a vacuum pump and/or a valve controlled fluidic connection to the capacitively coupled plasma (CCP) processing chamber may also be used.

During operation of the ICP apparatus 900, one or more process gases may be supplied through the gas flow inlets 960 and/or 970. In certain embodiments, process gas may be supplied only through the main gas flow inlet 960, or only through the side gas flow inlet 970. In some cases, the gas flow inlets shown in the figure may be replaced by more complex gas flow inlets and/or one or more showerheads, for example. The Faraday shield 949 and/or optional grid 950 may include internal channels and holes that allow delivery of process gases to the chamber. Either or both of Faraday shield 949 and optional grid 950 may serve as a showerhead for delivery of process gases. In some embodiments, a liquid vaporization and delivery system may be situated upstream of the chamber, such that once a liquid reactant or precursor is vaporized, the vaporized reactant or precursor is introduced into the chamber via a gas flow inlet 960 and/or 970. Example liquid precursors include $SiCl_4$ and silicon amides.

Radio frequency power is supplied from the RF power supply 941 to the coil 933 to cause an RF current to flow into and/or through the coil 933. The RF current flowing through the coil 933 generates an electromagnetic field about the coil 933, which generates an inductive current within the upper sub-chamber 902. The physical and chemical interactions of various generated ions and radicals with the wafer 919 selectively etch features of and deposit layers on the wafer, such as that discussed and described for the ALE and/or ALD processes shown in FIG. 1A, for example.

If the plasma grid is used such that there is both an upper sub-chamber 902 and a lower sub-chamber 903, the inductive current acts on gas present in the upper sub-chamber 902 to generate an electron-ion plasma in the upper sub-chamber 902. The optional internal plasma grid 950 limits the amount of hot electrons in the lower sub-chamber 903. In some embodiments, the apparatus is designed and operated such that the plasma present in the lower sub-chamber 903 is an "ion-ion" plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 903 through port 922. The chuck 917 disclosed herein may operate at elevated temperatures ranging between about 10° C. and about 250° C. The temperature will depend on the process operation and specific recipe.

The chamber may be coupled to facilities (not shown in FIG. 9) when installed in a clean room or a fabrication facility. Such facilities may include plumbing that provides processing gases, vacuum, temperature control, and/or environmental particle control. These facilities are coupled to the chamber, when installed in the target fabrication facility. Additionally, the chamber may be coupled to a transfer chamber that allows robotics to transfer semiconductor wafers into and out of the chamber using, for example, typical automation.

In some embodiments, a system controller 930 (which may include one or more physical or logical controllers) controls some or all of the operations of a processing chamber. The system controller 930 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and various other factors, for example.

In some implementations, a system controller, or controller 930 is part of a system, which may be part of and/or otherwise integrated with the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to collectively as the "controller," which may control various components or subparts of the system or systems. The controller 930, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide ($SiO_2$), surfaces, circuits, and/or dies of a wafer.

The controller 930, in some implementations, may be a part of or coupled to a computer that is integrated with, coupled to the system, otherwise networked to the system, or a combination thereof. For example, the controller may be in a "cloud" and/or "cloud"-type computer network or all or at least part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 930 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
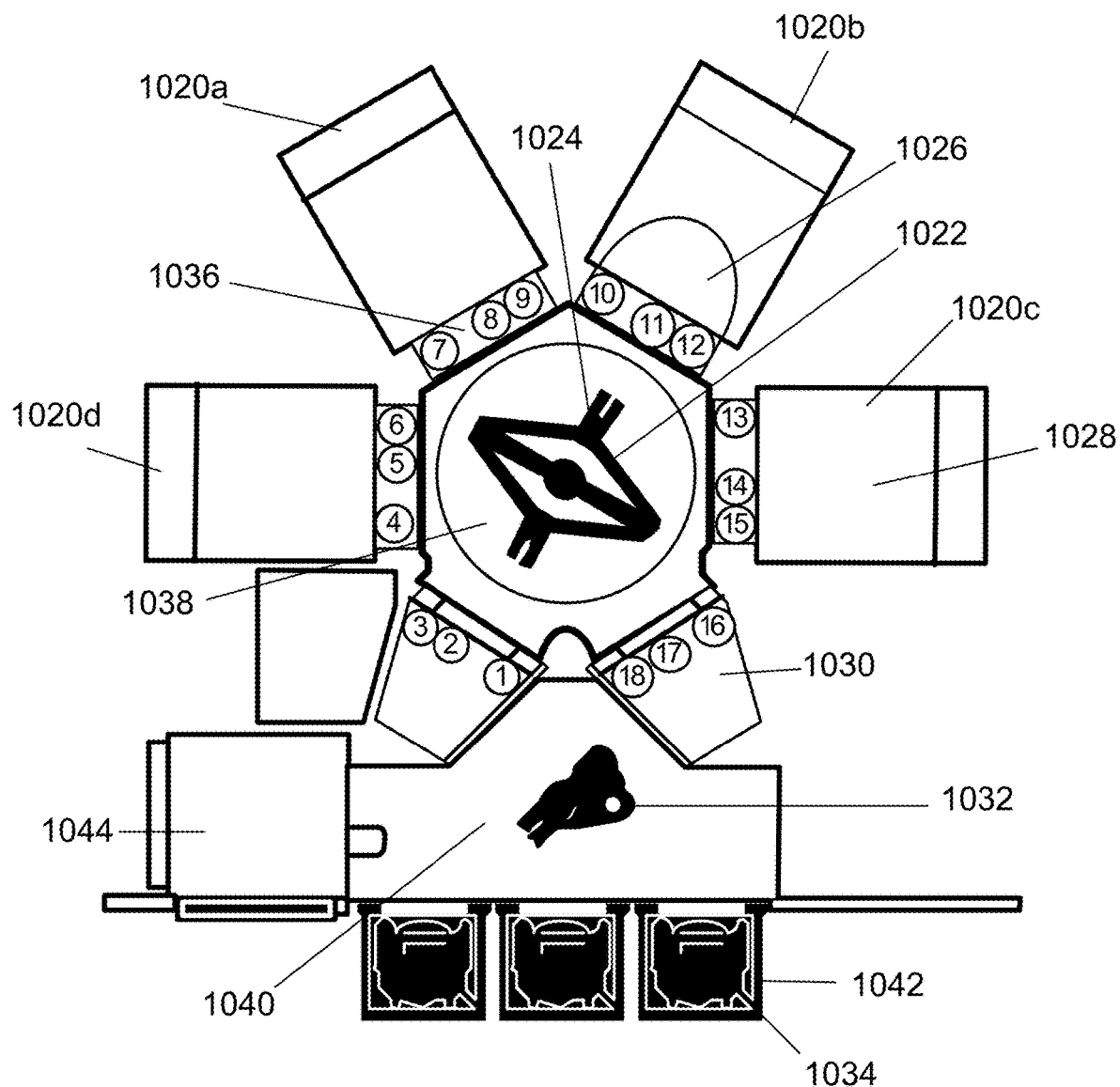
FIG. 10 is still another schematic diagram of an example process apparatus for performing disclosed embodiments.

FIG. 10 depicts a semiconductor process cluster architecture with various modules that interface with a vacuum transfer module 1038 (VTM). The arrangement of transfer modules to "transfer" wafers among multiple storage facilities and processing modules may be referred to as a "cluster tool architecture" system. Airlock 1030, also known as a "loadlock" or transfer module, is shown in VTM 1038 with four processing modules 1020a-1020d, which may be individual optimized to perform various fabrication processes. By way of example, processing modules 1020a-1020d may be implemented to perform substrate etching, deposition, ion implantation, wafer cleaning, sputtering, and/or other semiconductor-related processes. In some embodiments, ALD and ALE are performed in the same module. In some embodiments, ALD and ALE are performed in different modules of the same tool. One or more of the substrate etching processing modules (any of 1020a-1020d) may be implemented as disclosed herein, i.e., for depositing conformal films, selectively depositing films by ALD, etching patterns, and other suitable functions in accordance with the disclosed embodiments. Airlock 1030 and process module 1020 may be referred to as "stations." Each station has a facet 1036 that interfaces the station to VTM 1038. Inside each facet, sensors 1-18 are used to detect the passing of wafer 1026 when moved between respective stations.

Robot 1022 transfers wafer 1026 between stations. In one embodiment, robot 1022 has one arm, and in another embodiment, robot 1022 has two arms, where each arm has an end effector 1024 to pick wafers such as wafer 1026 for transport. Front-end robot 1032, in atmospheric transfer module (ATM) 1040, is used to transfer wafers 1026 from cassette or Front Opening Unified Pod (FOUP) 1034 in Load Port Module (LPM) 1042 to airlock 1030. Module center 1028 inside process module 1020a and/or 1020b is a suitable location for placing wafer 1026. Aligner 1044 in ATM 1040 is used to align wafers.

In an exemplary processing method, a wafer is placed in one of the FOUPs 1034 in the LPM 1042. Front-end robot 1032 transfers the wafer from the FOUP 1034 to the aligner 1044, which allows the wafer 1026 to be properly centered before it is etched or processed. After being aligned, the wafer 1026 is moved by the front-end robot 1032 into an airlock 1030. Because airlock modules have the ability to match the environment between an ATM and a VTM, the wafer 1026 is able to move between the two pressure environments without being damaged. From the airlock module 1030, the wafer 1026 is moved by robot 1022 through VTM 1038 into one of the process modules 1020a-1020d. Specifically, the robot 1022 uses end effectors 1024 located on each of its arms, for example, to grasp the wafer 1026 to move it as described, i.e. through VTM 1038 into one of the process modules 1020a-1020d. Once the wafer 1026 has been processed, it is moved by robot 1022 from the process modules 1020a-1020d to an airlock module 1030. From here, the wafer 1026 may be moved by the front-end robot 1032 to one of the FOUPs 1034 or to the aligner 1044.

It should be noted that the computer controlling the wafer movement can be local to the cluster architecture, or can be located external to the cluster architecture in the manufacturing floor, or in a remote location and connected to the cluster architecture via a network. Further, in some embodiments, a controller as described above with respect to FIGS. 7-9 may be implemented with the tool in FIG. 10.

Further, in some embodiments, that shown and described in connection with FIGS. 1 and/or 2, namely selective deposition by ALD at operations 104 and/or 204a, and subsequent reset of the nucleation delay differential between different substrate materials by ALE at operations 106 and/or 210, may be practiced and/or otherwise conducted in any one or more of the apparatuses shown and discussed in FIGS. 7-10.

Preferentially, in some embodiments, ALD in operations 104 and/or 204a is executed by a plasma-enhanced chemical vapor deposition (PECVD) product, such as those in the VECTOR® group of products available from Lam Research, Inc., of Fremont, Calif. Further, additional hybrid tool developed by Lam Research may include both VECTOR® and Kiyo™ products and/or tools on a common platform. Specifically, such a platform may include configurations directed toward the completion of ALD procedures on VECTOR® products and ALE procedures on Kiyo™ products, where both the VECTOR® and Kiyo™ are operationally integrated in a common cluster. Such a common cluster may allow for the ALD and/or ALE procedures described herein to be completed without a vacuum break, or without breaking vacuum, thus presenting a useful alternative to traditional process cycling in and/or between vacuum deposition and/or etch chambers.

Further, any combination of one or more (or all) of the ALD and/or ALE procedures shown and discussed in FIGS. 1-4 may be completed without otherwise comprising substrate surface integrity. Further, embodiments involving the integration of VECTOR® and Kiyo™ products and/or tools may result in optimal throughout, rather than attempts to complete the discussed ALD and/or ALE procedures on, for example, Kiyo™ products alone. Moreover, in some embodiments, placement of VECTOR® and Kiyo™ products and/or tools in the same cluster where ALD is performed on VECTOR® products and ALE is performed on Kiyo™ may eliminate or substantially reduce growth defects with reference to off-target deposition.

Additional integration of the described ALD and/or ALE procedures with other semiconductor-related processes is possible. Specifically, that shown and described in connection with FIGS. 1-3 may be implemented with gap fill applications, patterning, selective layer growth of subsequent layers from an initial layer, and/or selective protection of a layer during etch, such as ALE, procedures.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
(a) exposing a substrate housed in a chamber to alternating pulses of a first reactant and a second reactant to deposit a film over the substrate, the substrate having a first substrate material on which deposition of the film is intended and a second substrate material on which deposition of the film is not intended, the second substrate material being different from the first substrate material, and a nucleation delay for the first substrate material being less than a nucleation delay for the second substrate material according to a nucleation delay differential, which degrades upon proceeding with the film deposition; and
(b) exposing the substrate housed in the chamber to alternating pulses of an etching gas and a removal gas to etch a portion of the film deposited in (a) to reset the nucleation delay differential between the first and second substrate materials;
wherein (a) and (b) result in net deposition of the film on the first substrate material.

2. The method of claim 1 further comprising repeating (a) and (b) in the same chamber.

3. The method of claim 1, wherein the first reactant is a deposition precursor to modify a surface of the substrate, the second reactant is a reducing agent to deposit the material.

4. The method of claim 1, wherein the material to be deposited is aluminum nitride (AlN).

5. The method of claim 1, wherein the plurality of substrate materials are selected from a group consisting of silicon oxide ($SiO_2$), silicon nitride ($Si_3N_4$), silicon carbide (SiC), aluminum oxide ($Al_2O_3$), and aluminum nitride (AlN).

6. The method of claim 4, wherein trimethylaluminum provides aluminum for the aluminum nitride to be deposited.

7. The method of claim 1, wherein (a) and (b) are performed without breaking vacuum.

* * * * *